United States Patent [19]
Saiki et al.

[11] Patent Number: 5,867,333
[45] Date of Patent: *Feb. 2, 1999

[54] DATA RECORDING AND REPRODUCING APPARATUS AND PHASE LOCKED LOOP CIRCUIT FOR USE THEREIN INCLUDING D/A CONVERTERS ACTING AS CHARGE PUMPS AND A REFERENCE VOLTAGE SOURCE

[75] Inventors: Eisaku Saiki; Shintaro Suzumura, both of Yokohama; Kazutoshi Ashikawa, Maebashi; Tsuguyoshi Hirooka, Fujisawa; Seiichi Mita, Kanagawa-ken, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 513,507

[22] Filed: Aug. 10, 1995

[30] Foreign Application Priority Data

Aug. 18, 1994 [JP] Japan .................................. 6-193965

[51] Int. Cl.$^6$ ........................................................ G11B 5/09
[52] U.S. Cl. .............................. 360/51; 327/157; 331/16; 331/17; 375/376
[58] Field of Search ................................ 331/16, 17, 1 A, 331/57; 327/155–158, 145; 360/51, 32; 375/376

[56] References Cited

U.S. PATENT DOCUMENTS

| | | |
|---|---|---|
| 4,987,387 | 1/1991 | Kennedy et al. ........................ 331/1 A |
| 5,157,354 | 10/1992 | Saiki et al. .............................. 331/1 A |
| 5,382,922 | 1/1995 | Gersbach et al. ........................ 331/1 A |
| 5,384,671 | 1/1995 | Fisher ......................................... 360/51 |
| 5,436,938 | 7/1995 | Pigeon ..................................... 375/376 |
| 5,459,757 | 10/1995 | Minuhin et al. ....................... 360/51 X |
| 5,475,326 | 12/1995 | Masuda ................................... 327/157 |

FOREIGN PATENT DOCUMENTS 3-205920  9/1991  Japan .

OTHER PUBLICATIONS

Petersen et al, "A 3–5.5 V CMOS 32 Mb/s Fully Integrated Read Channel for Disk Drives" IEEE 1993 Custom IC Conference, 10.2.1–10.2.4.

*Primary Examiner*—Paul W. Huber
*Assistant Examiner*—Patrick Wamsley
*Attorney, Agent, or Firm*—Antonelli, Terry, Stout & Kraus, LLP

[57] ABSTRACT

A magnetic recording and reproducing apparatus such as a disk drive has a phase locked loop circuit which is less susceptible to an effect of noise of a power supply and ground and reduces a clock jitter. The magnetic recording and reproducing apparatus is compatible to a constant density recording system without increasing a circuit scale and a power consumption and with a small number of IC pins. The phase locked loop circuit of the magnetic recording and reproducing apparatus is provided with two D/A converter circuits to drive a loop filter. It is also provided with a circuit for distributing a reference potential of a voltage controlled oscillator (VCO) and a center frequency of the VCO, a gain of the VCO and a current gain of the D/A converter circuit are changed in linked relation. A reference voltage source is provided such that a center point or one end of the loop filter is connected to the reference voltage eliminating the ground connection.

10 Claims, 10 Drawing Sheets

FIG. 13

|  | THE PRESENT INVENTION | PRIOR ART REFERENCE 1 (FIG.10) | PRIOR ART REFERENCE 2 (FIG.11) |
|---|---|---|---|
| NOISE CHARACTERISTIC | ○ | × | ○ |
| CIRCUIT SCALE | ○ | ○ | × |
| POWER CONSUMPTION | △ | ○ | × |
| NUMBER OF PINS (FILTER) | 3 PINS OR LESS | 5 PINS OR MORE | 4 PINS |

○ : GOOD    × : NO GOOD    △ : MIDDLE

DATA RECORDING AND REPRODUCING APPARATUS AND PHASE LOCKED LOOP CIRCUIT FOR USE THEREIN INCLUDING D/A CONVERTERS ACTING AS CHARGE PUMPS AND A REFERENCE VOLTAGE SOURCE

BACKGROUND OF THE INVENTION

The present invention relates to a magnetic recording and reproducing apparatus, and more particularly to a phase locked loop circuit for generating a reproducing clock to read and reproduce data from a recording medium or generating a write clock for recording data.

A magnetic recording and reproducing apparatus, as shown in FIG. 9, generally comprises a magnetic recording medium 101 such as a magnetic disk, a magnetic head 118, a read/write (R/W) amplifier 102, a read signal processing circuit 103, a write signal processing circuit 104, a controller 105, a microprocessor or microcomputer 106, a servo control unit 107 and an interface unit (I/F) 108.

The read and write signal processing circuits may be implemented in various ways. As an example, in a partial response maximum likelihood (PRML) system, the read signal processing circuit comprises an AGC circuit 111, an analog-to-digital (A/D) converter circuit 112, a partial response (PR) equalizer circuit 113, a Viterbi encoder circuit 115, a demodulator circuit 116 and a phase locked loop (PLL) circuit 901.

The recording and reproducing of data in the magnetic recording apparatus are explained.

Recording data sent from a host to record it in the magnetic recording and reproducing apparatus is sent to the write signal processing circuit 104 through the I/F 108 and the controller 105, encoded to a recording code which fits to the recording medium and then written into the recording medium 101 by driving the magnetic head 118.

The data read from the magnetic recording medium 101 by the magnetic head 118 and the R/W amplifier 102 is applied to the read signal processing circuit 103, adjusted to a proper signal amplitude by the AGC circuit 111, and then converted from the analog signal to a digital signal by the A/D converter circuit 112 and it is equalized to exhibit a characteristic of a partial response inter-code interference between classes by the PR equalizer circuit 113. Then, it is decoded by the Viterbi detector circuit 115 and decoded to the original data from the recording code by the decoder circuit 116. The decoded data is sent to the host through the controller 105 and the I/F 108.

The positioning of the magnetic head 118 and the rotation of the magnetic recording medium 101 are controlled by the servo control unit 107 and the microcomputer 106. In a data surface servo system, a portion of the read data forms servo data and a servo data signal a111 is outputted from the read signal processing circuit 103 and it is used to control the positioning of the magnetic head 118.

The phase locked loop circuit 901 generates a sampling clock a106 of the A/D converter 112 and comprises a phase detection circuit 921, a digital-to-analog (D/A) converter circuit 922, a loop filter 923 and a voltage controlled oscillator (VCO) 924.

The phase detection circuit 921 detects a phase error of the sampling timing from the output signal a101 of the PR equalizer circuit 113 and outputs control data a902. The D/A converter circuit 922 outputs an analog current a903 corresponding to the digital control data a902, and it is integrated and filtered by a loop filter a923 to produce an input control voltage to the VCO 924. In this manner, the VCO 924 is controlled to synchronize the sampling clock a106.

The electronic circuits shown in FIG. 9 including the phase locked loop circuit 901 are integrated in one chip and the loop filter 923 is an off-chip element. A white circle (○) of the loop filter 923 represents off-chip pins. In FIG. 9, it indicates that one pin is required for the loop filter 923.

On the other hand, in the magnetic disk drive, a constant density recording system is primarily used to improve the recording capacity and means to modify the characteristic of the phase locked loop circuit 901 accordingly is required. In FIG. 9, the microcomputer 106 performs the control and produces control signals s101 and s102.

The constant density recording system is disclosed in JP-A-3-205920 (hereinafter referred to as a prior art reference 1) and IEEE 1993 CICC article "A 3–5.5V CMOS 32 Mb/s Fully Integrated Read Channel for Disk Drives (hereinafter referred to as a prior art reference 2).

In the prior art reference 1, a circuit for switching a loop filter 1003 of a phase locked loop circuit 901 as shown in FIG. 10 is used as the means to cope with the constant density recording system.

On the other hand, in the prior art reference 2, a loop 1105 is formed into a full differential type as shown in FIG. 11 and it is driven by four D/A converter circuits 1101 1104 (which may be charge pumping circuits in the peak detection type signal processing). Inputs to the VCO 1106 are differential inputs and connected to the opposite ends of the loop filter 1105. In this system, current gains of the D/A converter circuits 1101~1104 may be changed to control a loop gain and an attenuation factor of the phase locked loop circuit 901.

In the magnetic disk drive, the effort to increase a data transfer rate has been attempted for those years and the clock frequency has been increased to 100 MHz, for example. As a result, a specification to a timing margin is severe and the phase locked loop circuit has to suppress a clock jitter as much as possible. However, as the processing speed of the circuit increases, noises of a power supply and ground (GND) of a circuit board of the disk drive tend to increase more and more and this causes the increase of the clock jitter. Particularly, in a small size magnetic disk drive of less than 2.5 inches, since a power is supplied from the system and not from a regulated power supply, the noise immunity of the power supply line is weak and the low impedance of the circuit board wiring is not sufficient to cope therewith. Thus, countermeasure by the circuit configuration is needed.

As for the GND noise, a potential difference between GND in the IC and GND of the circuit board of the disk drive should be noticed. As described above, the electronic circuits are integrated and the respective circuits operate with reference to the GND potential of the IC. Where a noise is included in the GND of the circuit board of the disk drive, the noise may be introduced into the IC through the off-chip element connected to the GND of the circuit board.

It is therefore an important problem to reduce the logic jitter for the noises of the power supply and GND of the circuit board which are more and more becoming prominent as the transfer rate and the miniaturization of the disk drive are increased.

For the electronic circuit including the read signal processing circuit 103 and the write signal processing circuit 104, the user request to reduce the cost and the power consumption is strong. In order to attain it, it is an important problem to reduce the circuit scale of the respective circuits as much as possible to reduce the power consumption, enhance the integration and suppress the number of pins as small as possible to allow the use of an inexpensive IC package.

As to the constant density recording system, the following problem is also encountered.

In the prior art reference 1, as shown in FIG. 10, one end of the loop filter 1003 is connected to the GND. As a result, an AC potential difference between the GND and the reference potential in the VCO appears as a noise which is introduced into the input signal to the VCO to cause the clock jitter. Further, as the precision of the attenuation factor is increased, the number of the off-chip resistors required increases more and more and the number of pins increases.

On the other hand, in the prior art reference 2, as shown in FIG. 11, the loop filter 1105 is of full differential type which is resistive to the GND and power supply noises. However, in this prior art system, four D/A converter circuits are necessary and the circuit scale and the power consumption increase.

SUMMARY OF THE INVENTION

It is an object of the present invention to provide a phase locked loop circuit which can reduce the circuit scale, the power consumption and the number of pins of the IC in the constant density recording system and reduce the clock jitter, and a signal processing circuit using the same, and further a high performance and low cost magnetic recording and reproducing apparatus using the same.

It is another object of the present invention to provide a phase locked loop circuit which can reduce the circuit scale, the power consumption and the number of pins and reduce the clock jitter in a prior art system in which data is reproduced at a fixed clock frequency and a signal processing circuit using the same, and further a high performance and low cost magnetic recording and reproducing apparatus using the same.

In order to achieve the above objects, in accordance with one aspect of the present invention, two D/A converter circuits or charge pumping circuits are provided in the phase locked loop circuit to drive the loop filter, and the gain of the D/A converter circuits or the charge pumping circuits and the gain of the VCO are switched in accordance with the VCO frequency.

In accordance with another aspect of the present invention, a current distributor circuit is provided in the phase locked loop circuit and an externally controllable current source as shown by 403 in FIG. 6 is provided in the VCO for the constant density recording.

In accordance with a further aspect of the present invention, a reference potential source is provided in the phase locked loop circuit and a center point of the loop filter is grounded to the reference potential.

In accordance with another aspect of the present invention, a reference potential source is provided in the phase locked loop circuit and one end of the loop filter is grounded to the reference potential.

In accordance with the present invention, the switching of the loop gain of the phase locked loop circuit and the control of the attenuation factor which are necessary for the constant density recording system are attained by a small number of switching circuits so that the circuit scale and the power consumption are reduced.

In accordance with the present invention, since the loop filter is not connected to the GND, it is less susceptible to the GND noise and the clock jitter may be reduced and the timing margin may be increased. As a result, the recording capacity of the disk drive and the transfer rate can be increased.

Further, since the circuit scale and the power consumption is reduced and the number of pins is reduced, an inexpensive IC package may be used. This is advantageous in one-chip IC implementation and the reduction of the cost.

Other objects, features and advantages of the present invention will be apparent from the following description of the embodiments taken in conjunction with the accompanying drawings.

BRIEF DESCRIPTION OF THE DRAWINGS

FIG. 13 is a comparative chart showing performance of the phase locked loop circuit which shows an effect of the present invention.

DETAILED DESCRIPTION OF THE PREFERRED EMBODIMENTS

[Embodiment 1]

Figure 1:
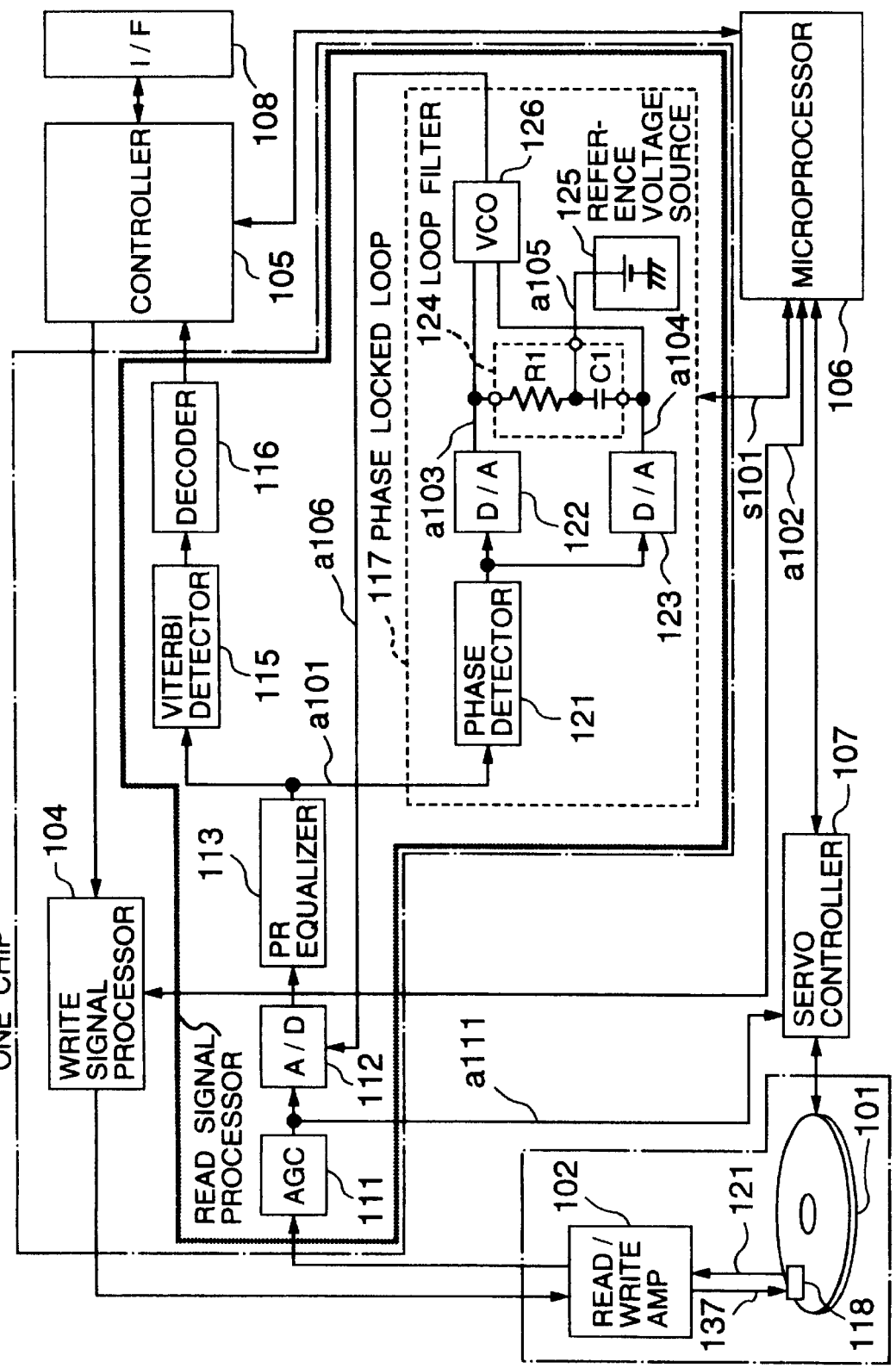
FIG. 1 is a block diagram showing a magnetic recording and reproducing apparatus of Embodiment 1.
Figure 9:
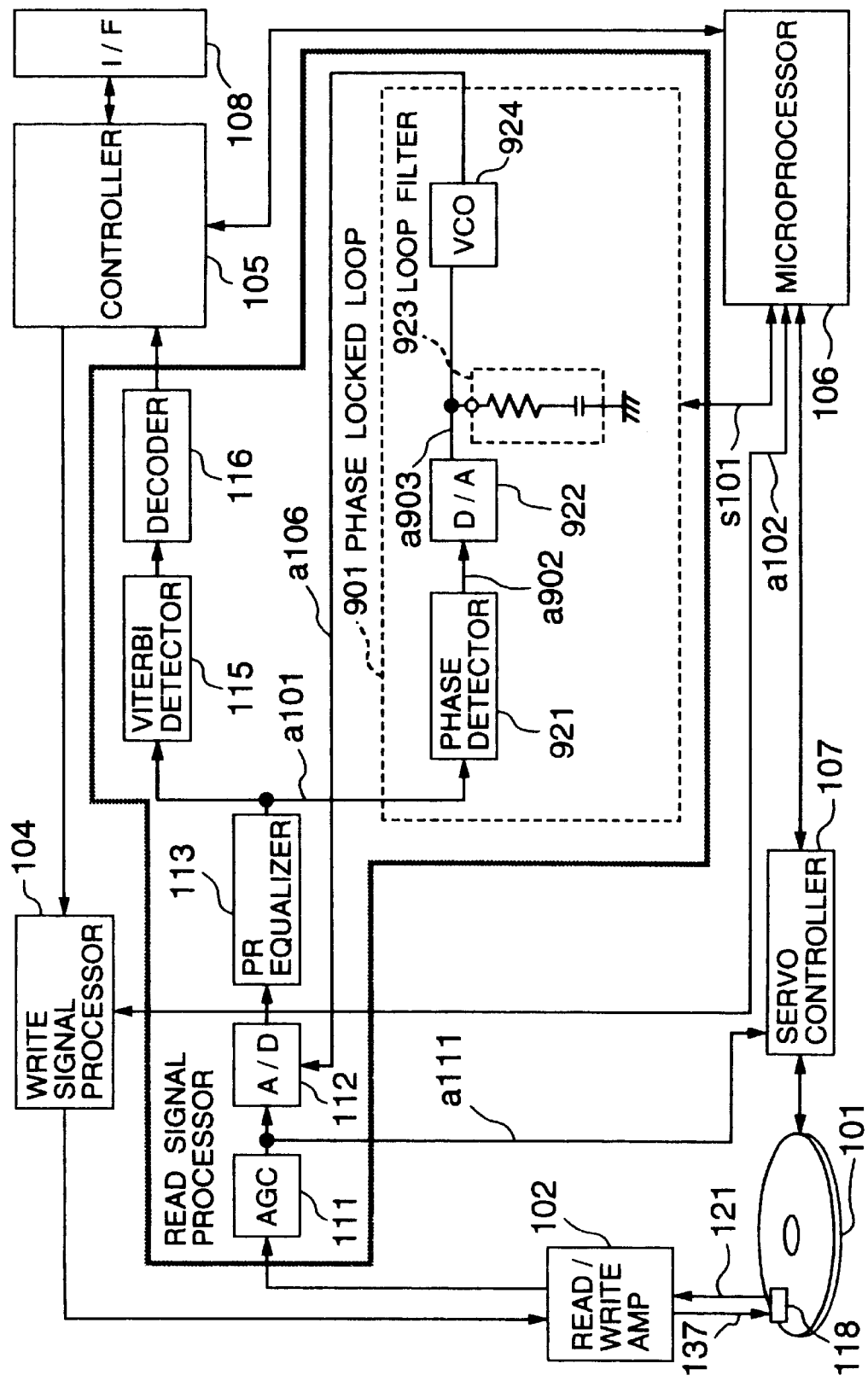
FIG. 9 is a block diagram showing a prior art magnetic recording and reproducing apparatus.
Figure 11:
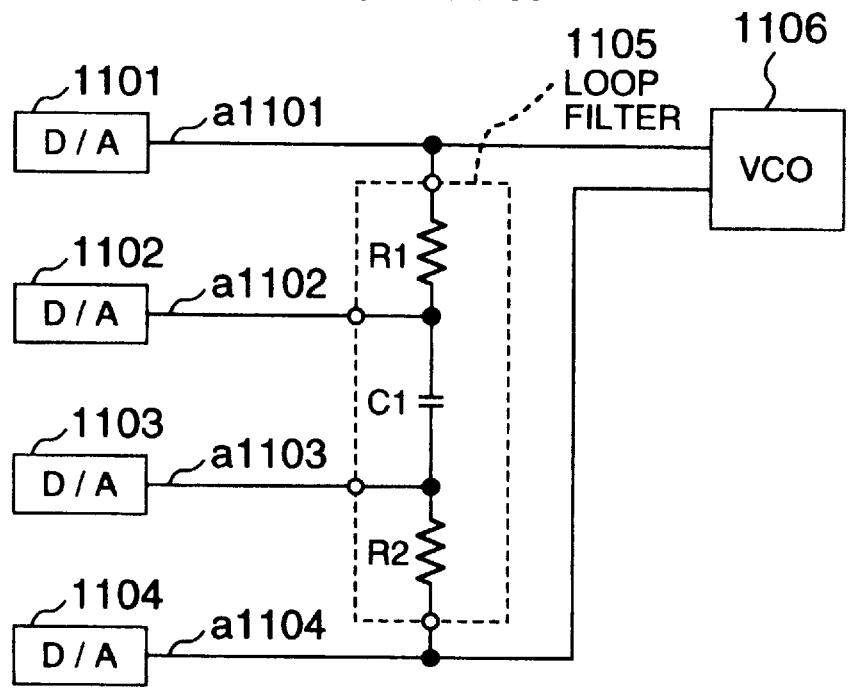
FIG. 11 is a block diagram showing a loop filter of a phase locked loop circuit of the prior art reference 2.

FIG. 1 shows a block diagram of one embodiment of the recording and reproducing apparatus of the present invention. In FIG. 1, a phase locked loop circuit 117 comprises a phase detection circuit 121, D/A converter circuits 122 and 123, a loop filter 124, a reference voltage source 125 and a VCO 126. Output signals a103 and a104 of the D/A converter circuits 122 and 123 are connected to the opposite ends of the loop filter 124 and an input of the VCO 126 and a center point a105 of the loop filter 124 is connected to the reference voltage source 125. A white circle (○) in the loop filter 124 indicates an off-chip pin as it does in FIG. 9. In the present example, it shows that three pins are needed. In the circuit configuration of FIG. 1, all circuits excluding a drive system including a medium 101 and a data read/write head 118 and an amplifier 102 are formed on one circuit board, and of those, read/write signal processing circuits 103 and 104 excluding a controller 105, a microcomputer or microprocessor 106, an I/F 108, a servo control system 107 and the loop filter 124 are integrated in one chip semiconductor substrate.

Figure 2:
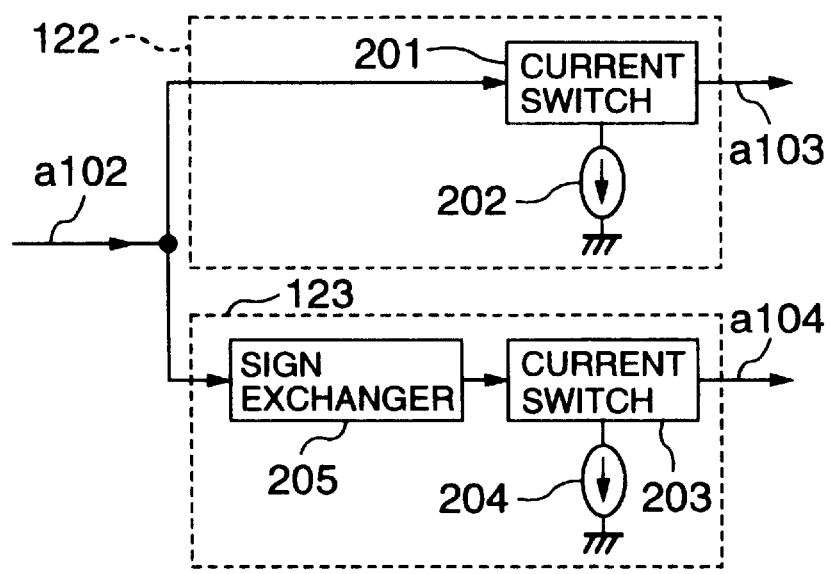
FIG. 2 is a block diagram showing a D/A converter circuit in a phase locked loop circuit of the Embodiment 1.

FIG. 2 shows an embodiment of the configuration of the D/A converter circuits 122 and 123. The D/A converter circuit 122 comprises a current switch 201 and a current source 202. The D/A converter circuit 123 comprises a current switch 203, a current source 204 and a sign exchange circuit 205. The D/A converter circuit 122 receives an output signal a102 of the phase detection circuit 121 to turn on or off the current switch 201 and output an analog current a1O3 corresponding to a digital phase error. Since the D/A converter circuit 123 inverts the code by the inverter circuit 205, the output current a104 is of opposite phase to the output current a103 of the D/A converter circuit 122. A ratio of the output current to the input phase error is a gain of the D/A converter circuit and a gain Kd1 of the D/A converter circuit 122 may be set by the current source 202 and a gain Kd2 of the D/A converter circuit 123 may be set by the current source 204.

Figure 3:
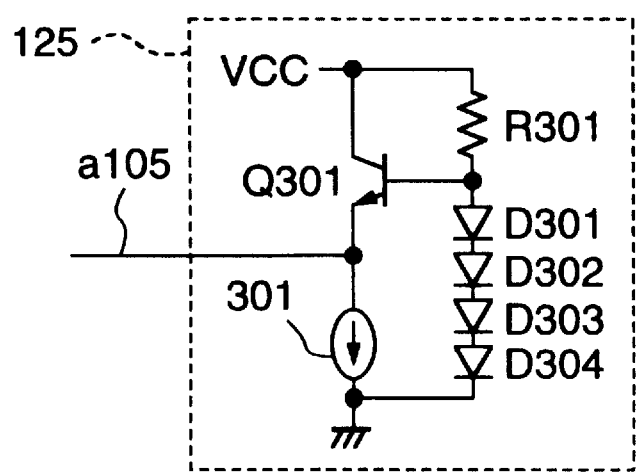
FIG. 3 is a block diagram showing a reference voltage source in the phase locked loop circuit of the Embodiment 1.

FIG. 3 shows an embodiment of the configuration of the reference voltage source 125. It may comprise a transistor Q301, a current source 301, a resistor R301 and diodes D301~D304. In the present configuration, since the base voltage of the transistor Q301 is fixed by a voltage corresponding to four diodes from the GND, the affect of the variation of the power supply may be reduced. Alternatively, a band gap constant voltage source may be used.

Figure 4:
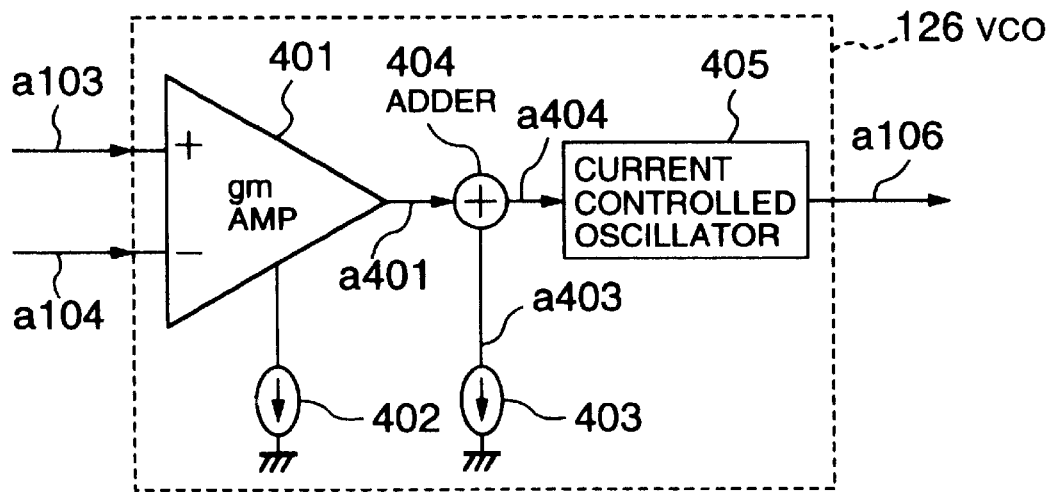
FIG. 4 is a block diagram showing a VCO in the phase locked loop circuit of the Embodiment 1.

FIG. 4 shows an embodiment of a configuration of the VCO 126. It may comprise a differential input type gm amplifier 401, current sources 402 and 403, an adder 404 and a current controlled oscillator 405. In the present VCO 126, the gm amplifier 401 outputs a current a401 in accordance with a voltage difference between the differential input signals a103 and a104. The adder 404 adds the current a401 and a reference current a403 outputted by the current source 403 to output a control current a404. The voltage controlled oscillator 405 outputs a clock a106 in accordance with the control current a404. A center frequency of the present VCO 126 is an oscillation frequency when the voltage difference between the differential input signals a103 and a104 is zero, that is, the output a401 of the gm amplifier 401 is zero, and the reference current a403 outputted by the current source 403 is the control current a404 as it is. Thus, the center frequency may be controlled by controlling the current source 403. The gain Ko of the VCO may be controlled by the gain of the gm amplifier 401 which in turn may be controlled by the current source 402.

An operation of the phase locked loop circuit 117 is now explained.

The phase detection circuit 121 detects a sampling timing based on an output signal a113 of the PR equalizer circuit 113 to output the phase error signal a102. The D/A converter circuits 122 and 123 output currents corresponding to the phase error signal a102. The output signals a103 and a104 are of opposite phase and when the output signal a103 is flowing out, the output signal a104 is flowing in. The loop filter 124 integrates the output currents to convert to a voltage. Since the center point a105 of the loop filter is connected to the reference voltage source 125 to fix the voltage, only the output current a103 of the D/A converter circuit 122 flows through a resistor R1 of the loop filter 124 and only the output current a104 of the D/A converter circuit 123 flows through a capacitor C1.

The VCO 126 receives the voltage across the loop filter 124 as the differential signal to change the frequency of the output clock a106 to synchronize the sampling timing.

Since the loop filter is not connected to the external GND in the present phase locked loop circuit 117, it is less susceptible to the effect of the GND noise. Where the signal processing circuit is integrated, the number of pins necessary for the off-chip elements is only three.

Figure 5A:
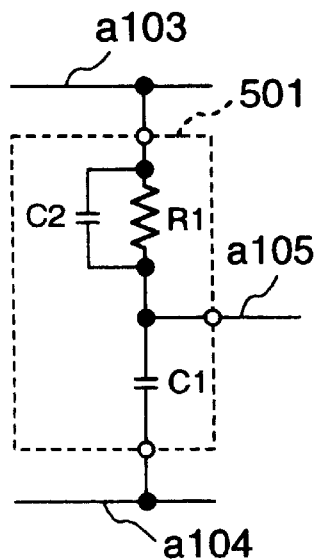
FIGS. 5A and 5B show modifications of the loop filter in the phase locked loop circuit of the Embodiment 1.
Figure 5B:
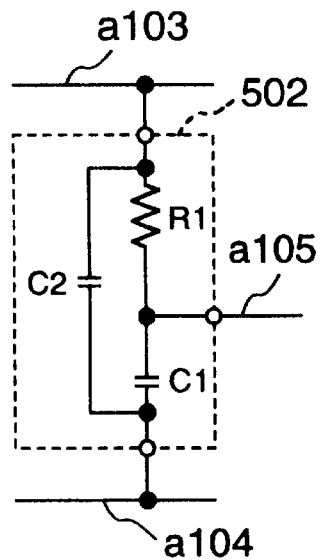

The loop filter 124 shown in FIG. 1 may have a capacitor C2 added thereto as shown in FIG. 5A or FIG. 5B. In either FIG. 5A or FIG. 5B configuration, an impedance at a high frequency is reduced and the noise may be reduced.

Figure 12:
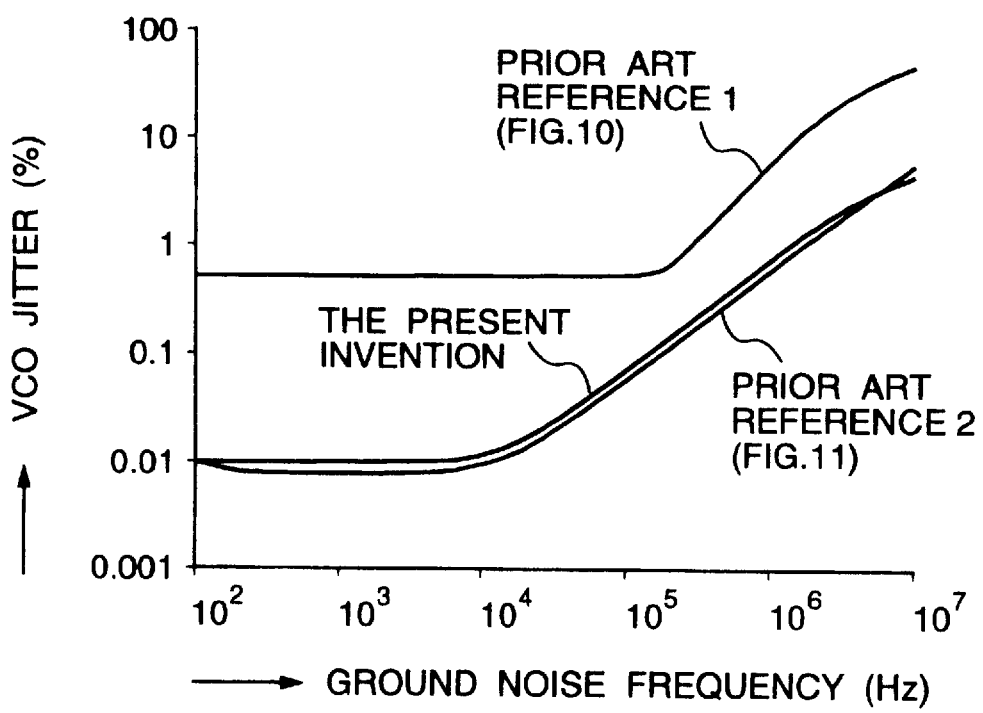
FIG. 12 is a graph showing frequency response of a VCO jitter for a GND noise which shows an effect of the present invention.

As a qualitative effect of the present embodiment, a graph of analysis by a circuit simulation is shown in FIG. 12. The graph shows a frequency response of a jitter of the VCO when a noise is added to the external substrate GND. The smaller the jitter is, the less is the effect by the noise and the higher is the performance.

The prior art reference 1 and the prior art reference 2 are compared with the configuration of the present invention shown in FIG. 1. It is seen that the configuration of the present invention is several times to several tens times less susceptible to the effect of the noise than the prior art reference 1. When compared with the prior art reference 2 of the full differential type, it is seen that equivalent noise rejection effect is attained.

FIG. 13 shows a comparative chart for the prior art with respect to the circuit scale, the power consumption and the number of pins required for the off-chip loop filter of the phase locked loop circuit. In the prior art reference 2, four D/A converter circuits are required so that the circuit scale is large, the power consumption is large and the number of pins is large. On the other hand, in the present invention, only two D/A converter circuits are required and the switching circuit to comply with the constant density recording system is small so that the circuit scale and the power consumption may be small and the number of pins may be no larger than three.

[Embodiment 2]

Figure 6:
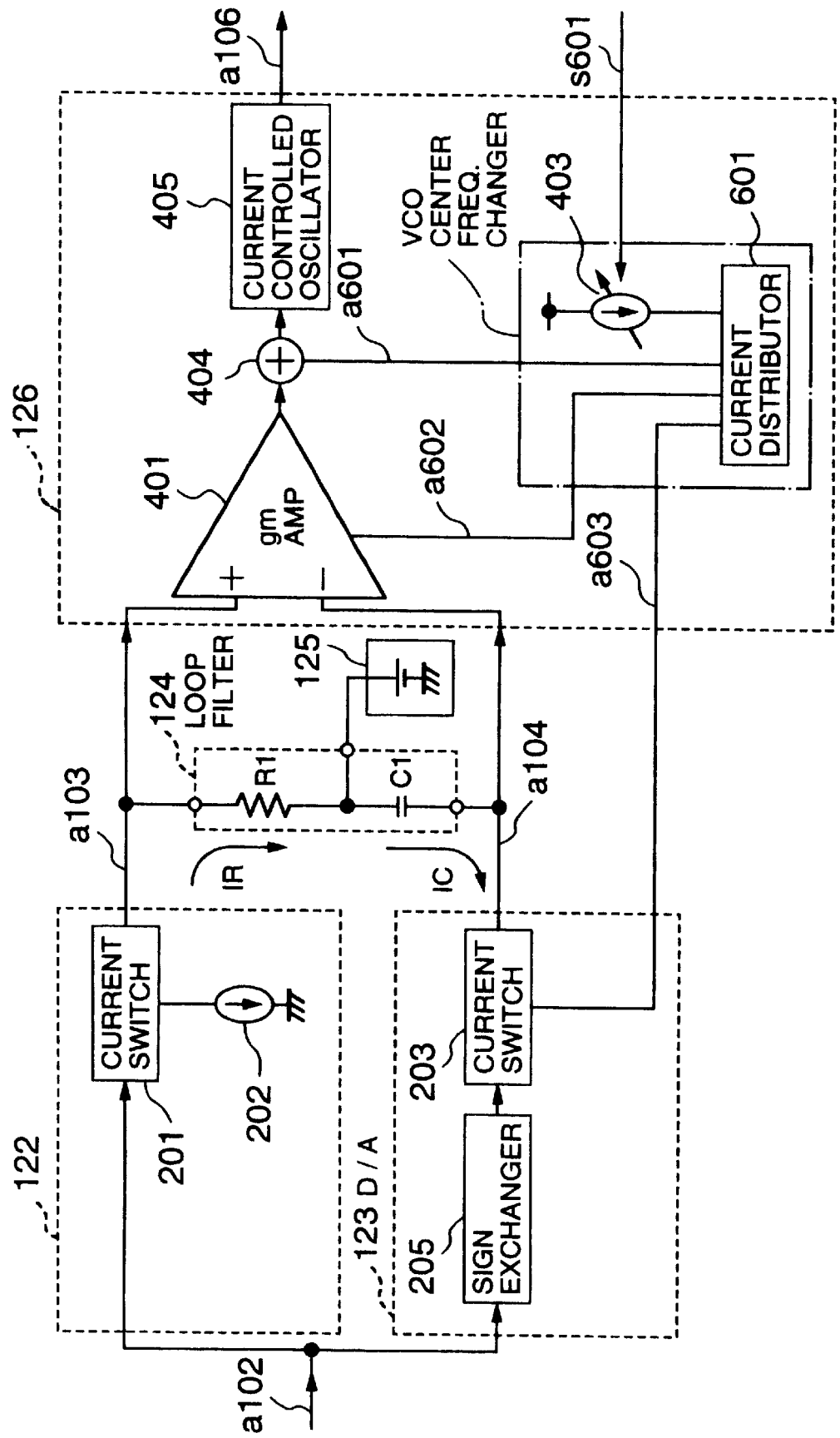
FIG. 6 is a partial block diagram showing a phase locked loop circuit of Embodiment 2.

FIG. 6 shows another configuration for the constant density recording system in the phase locked loop circuit of the present invention. The D/A converter circuit 122 is of non-inversion type and the D/A converter circuit 123 is of inversion type. The loop filter 124 is connected to the outputs of the both circuits. In order to cope with the constant density recording system, the phase locked loop circuit switches the center frequency of the VCO and the setting of the loop gain. For example, when the head is moved from a track zone of the disk to a track zone having a double radius ration thereto to reproduce the data, it is necessary that the phase locked loop circuit doubles the oscillation frequency of the VCO 126 and the loop gain of the phase locked loop circuit is doubled assuming that the attenuation factor is fixed.

In the present embodiment, a current distribution circuit 601 and a current source 403 controlled by the microcomputer 106 based on a control signal s601 are provided in the VCO 126. The control signal s601 is generated from the control signal slol outputted from the microcomputer 106 through a register, not shown.

As the track zone is moved, the microcomputer 106 controls the current source 403 in the VCO 126 so that the currents a601~a603 are changed. When the current of the current source 403 is doubled, the current a601 is doubled and the center frequency of the VCO is doubled. At the same time, the current a602 is also doubled and the gain of the gm amplifier 401 is doubled so that the VCO gain Ko is doubled.

As the current a603 is doubled, the current gain Kd2 of the inversion type D/A converter circuit 123 is doubled. Namely, the current a603 which is proportional to the center frequency of the VCO after switching is supplied to the inversion type D/A converter circuit 123.

The loop gain ωn is given by $$\omega n = \sqrt{(Kd2 \cdot Ko/C1)} \quad (1)$$

Thus, when Kd2 and Ko are doubled, respectively, ωn may be doubled.

In the present phase locked loop circuit, since the center point of the loop filter is grounded to the fixed potential, R1 appears by the ratio of a current IR flowing through R1 and a current IC flowing through C1. Accordingly, the attenuation factor ζ is given by $$\zeta = (C1 \cdot \omega n/2) \cdot R1 \cdot (IR/IC) \quad (2)$$

By using the gain Kd1 of the D/A converter circuit 122 and the gain Kd2 of the D/A converter circuit 123, the formula (2) is expressed as follows:

$$\zeta = (C1 \cdot \omega n/2) \cdot R1 \cdot (Kd1/Kd2) \quad (3)$$

From the formula (3), it is seen that ζ may be kept fixed when Kd1 is fixed and ωn and Kd2 are simultaneously doubled. In this manner, the switching of the center frequency and the loop gain may be simultaneously conducted. The current distributor circuit 601 may be readily implemented by a current mirror circuit using bipolar or MOS transistors.

In the phase locked loop circuit of the present embodiment, the compliance to the constant density recording system is attained by switching only the reference current in the VCO. As a result, the switching circuit is not required for each circuit and the circuit scale may be further reduced.

Further, since it is not necessary to set the current for each circuit, the setting is facilitated.

[Embodiment 3]

Figure 7:
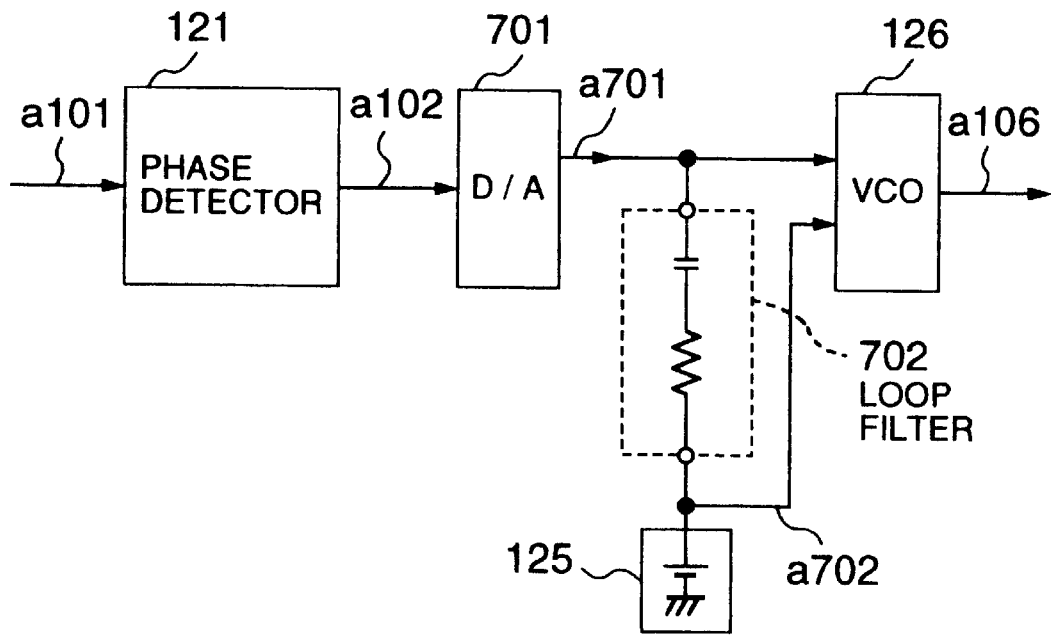
FIG. 7 is a block diagram showing a phase locked loop circuit of Embodiment 3.
Figure 10:
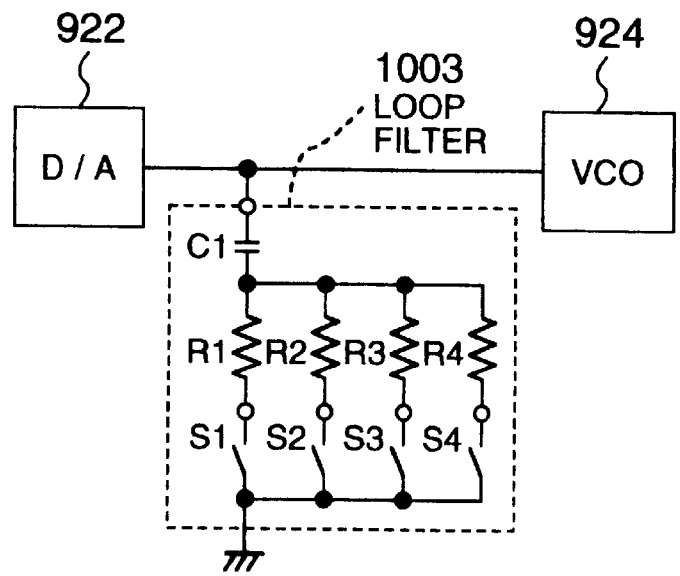
FIG. 10 is a block diagram showing a loop filter of a phase locked loop circuit of the prior art reference 1.

FIG. 7 shows an embodiment for reproducing data at a fixed frequency rather than the constant density recording system. One side of the loop filter rather than the center point is grounded to the reference potential. In the present configuration, only one D/A converter circuit is required and the circuit scale may be further reduced and it is less susceptible to the effect of the GND noise as it is in the previous embodiment. When the signal processing circuit is integrated in the present embodiment, the number of pins required for the off-chip loop filter is two.

[Embodiment 4]

Figure 8:
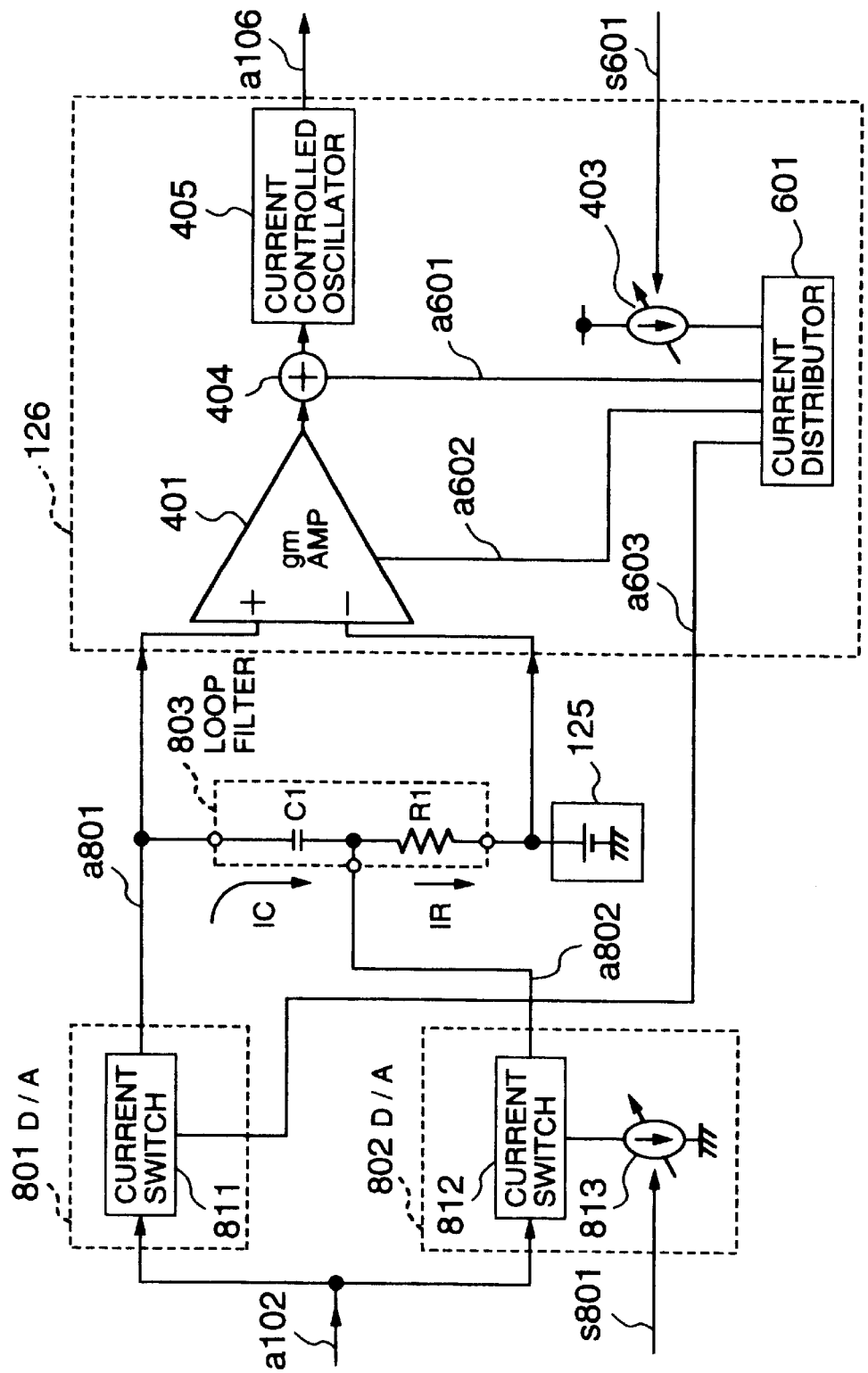
FIG. 8 is a block diagram showing a phase locked loop circuit of Embodiment 4.

FIG. 8 shows an embodiment which complies to the constant density recording system in the system in which one end of the loop filter is grounded as shown in the Embodiment 3. A D/A converter circuit 801 is of same polarity to a D/A converter circuit 802. In this case, the D/A converter circuit 802 outputs an output current a802 in phase to an output current a801 and is provided with a current source 813 which is controllable by a control current s801 from the microcomputer 106. The control signal s801 is generated from the control signal s101 outputted by the microcomputer 106 through a register, not shown, as is the control signal s601 controlling the current source 403.

The loop gain ωn in the present configuration is given by $$\omega n = \sqrt{(Kd3 \cdot Ko/C1)} \quad (4)$$

where Kd3 is a current gain of a801 and Kd4 is a current gain of a802. It is seen from the formula (4) that the loop gain ωn may comply with the constant density recording system by linking Kd3 and Ko to the switching of the center frequency of the VCO by using the current distribution circuit 601 as it is in FIG. 6.

The attenuation factor ζ is given by the formula (2) as described above. The current IC flowing through C1 is the output current of the D/A converter circuit 801 and the current IR flowing through R1 is the sum of the output currents of the D/A converter circuit 801 and the D/A converter circuit 802. Thus, it may be represented by $$\zeta = (C1 \cdot \omega n/2) \cdot R1 \cdot ((Kd3+Kd4)/Kd3) \quad (5)$$

In this case, since ωn and Kd3 are changed simultaneously, the microcomputer 106 control the current source 813 by the control signal s801 to adjust the Kd4 so that ζ is kept constant.

The phase locked loop circuit of the present invention described above may be equally applied to a write clock generation circuit of the write signal processing circuit 104.

[Embodiment 5]

Figure 14:
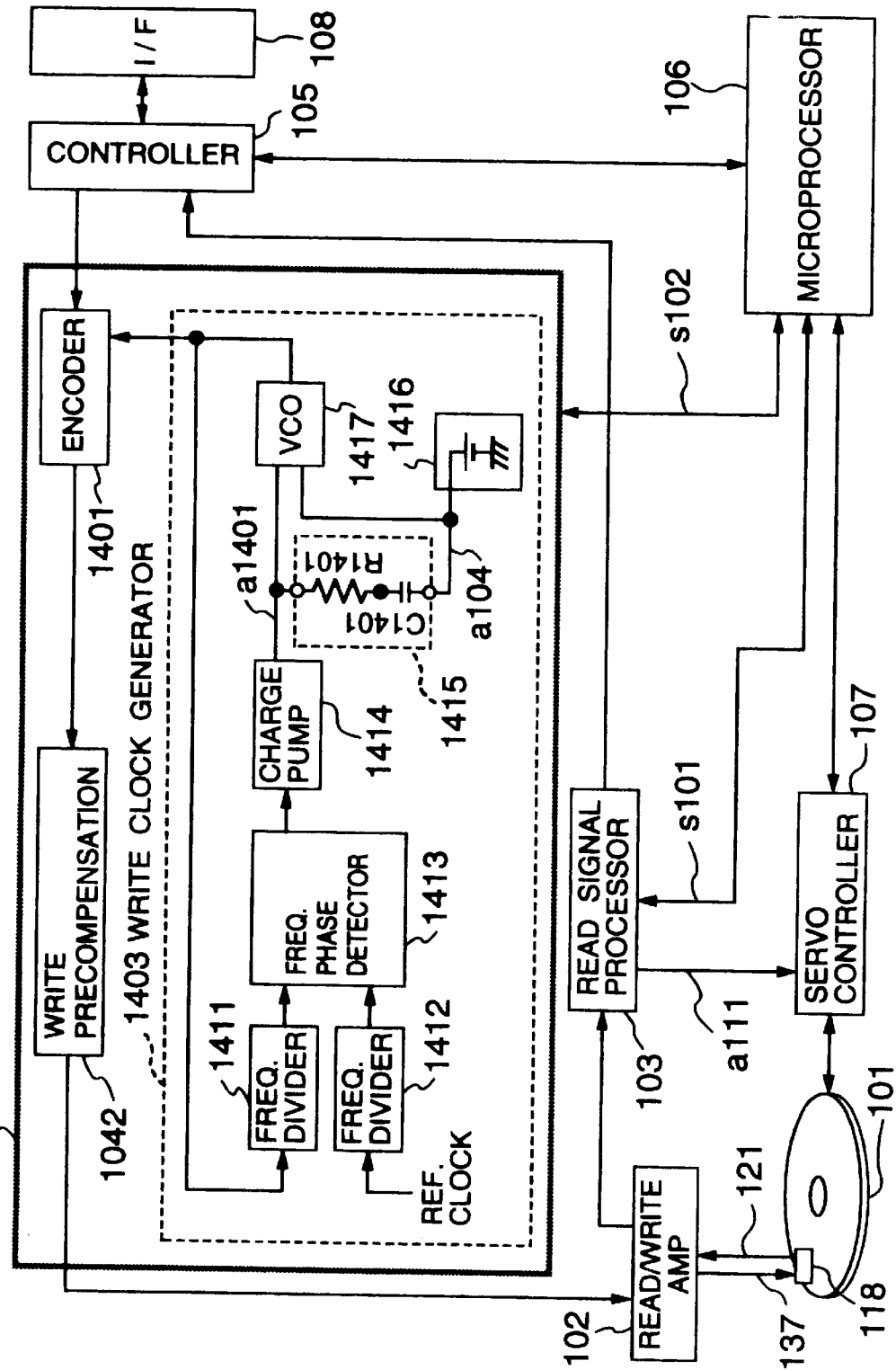
FIG. 14 is a block diagram showing another embodiment in which the phase locked loop circuit of the present invention is applied to a write clock generator.

FIG. 14 shows another embodiment of the recording and reproducing apparatus in which the phase locked loop circuit according to the present invention is applied to a write clock generating circuit of the write signal processor 104 of FIG. 1, where like numerals and symbols indicate like components and blocks in FIG. 1 embodiment.

In FIG. 14, the write signal processor 104 includes an encoder 1401, a write precompensation circuit 1402 and a write clock generator 1403. A recording data from the controller 105 is converted by the encoder 1401 into a code in a form adapted for magnetic recording, such as 8–9 GCR, and is then applied to the write precompensation circuit 1402 at a clock timing which is established by the write clock generator 1403. In the write precompensation circuit 1402, in order to compensate a phase shift of the recording data due to magnetic interference the phase of the recording data is deviated before or after the current phase position in accordance with a pattern of the data. Thereafter, the recording data subject to phase compensation in the write precompensation circuit 1402 is sent to the R/W amplifier 102 and is recorded on the recording medium 101.

The write clock generator 1403 is exemplified by a PLL synthesizer usually known, which includes frequency dividers or prescalers 1411, 1412, a frequency phase detector 1413, a charge pump 1414, a loop filter 1415, a reference voltage source 1416 and a VCO 1417.

In the write clock generator, the frequency and phase of the output of the frequency divider 1411 is controlled to coincide with those of the frequency divider 1412 to generate a write clock. In this manner, the frequency of the write clock can be set at a desired value by selecting the division ratio of the frequency dividers 1411 and 1412 at a suitable value. To apply to a constant density recording system, the frequency of the write clock can be changed, by setting the division ratio of dividers 1411 and 1412 in accordance with the track zone by a control signal s102 from the microprocessor 106.

In the configuration of FIG. 14 embodiment, since the loop filter 1415 is not connected to the ground GND of the external circuit board as previously referred to on FIG. 7 etc., a less-jitter, high-accuracy, write clock can be obtained without subjecting to the ground noise.

While the signal processing circuit which uses the PRML system for the read and write signal processing circuits have been shown and described, the present invention is also applicable to other signal processing system.

What is claimed is:

1. A magnetic recording and reproducing apparatus comprising:
    recording means for recording record data to a magnetic recording medium by a constant density recording system;
    a phase locked loop circuit including two complementary charge pumps, a loop filter which is not directly connected to ground and a voltage controlled oscillator (VCO) having differential inputs connected across said loop filter for generating an operation clock; and
    reproducing means for modifying a loop characteristic of said phase locked loop circuit for the record data to reproduce the recorded data;
    said phase locked loop circuit including a circuit for changing a gain of only one of said two charge pumps, a gain of said VCO and a frequency of said VCO in linked relation to each other in accordance with a read position signal for said recording medium;
    wherein said phase locked loop circuit includes a dedicated reference voltage source and a center point of said loop filter is connected to said reference voltage source.

2. A magnetic recording and reproducing apparatus comprising:
    a recording circuit for recording record data to a magnetic recording medium;
    a phase locked loop circuit including two D/A converter circuits, a loop filter which is not directly connected to ground and a voltage controlled oscillator (VCO) having differential inputs connected across said loop filter;
    said two D/A converter circuits and said VCO being formed on an integrated circuit (IC) substrate having a reference voltage source therein;
    a center point of said loop filter being connected to said reference voltage source.

3. A magnetic recording and reproducing apparatus according to claim 2 wherein components of said loop.

4. A magnetic recording and reproducing apparatus comprising:
    a phase locked loop circuit including complementary charge pumps, a loop filter which is not directly connected to ground and a voltage controlled oscillator having differential inputs connected across said loop filter for generating a write clock for recording record data on a magnetic recording medium;
    wherein said phase locked loop circuit includes a reference voltage source separate from the ground and a center point of said loop filter is connected to said reference voltage source.

5. A phase locked loop circuit for a disk drive comprising complementary D/A converter circuits, a loop filter which is not directly connected to ground, a voltage controlled oscillator having differential inputs connected across said-loop filter and a change circuit for changing a gain of only one of said complementary D/A converter circuits, a gain of said VCO and a frequency of said VCO in linked relation in accordance with a read position signal for the disk and a reference voltage source independent from the ground, wherein a center point of said loop filter is connected to said reference voltage source.

6. A phase locked loop circuit including complementary charge pumps, a loop filter which is not directly connected to ground, and a voltage controlled oscillator having differential inputs connected across said loop filter for generating a reproducing clock for reproducing data from a disk or a write clock for recording data,
    said complementary charge pumps and said voltage controlled oscillator being formed on a semiconductor substrate together with a reference voltage source other than the ground;
    a center point of said loop filter being connected to said reference voltage source.

7. A phase locked loop circuit according to claim 6, wherein said voltage controlled oscillator includes a VCO current source controlled as a track zone on the disk is moved and a current distributor circuit for supplying a current proportional to a VCO center frequency changed thereby to one of said complementary charge pumps.

8. A magnetic recording and reproducing apparatus comprising:
    a recording signal processing circuit for recording record data to a recording medium by a constant density recording system;
    a reproducing signal processing circuit for reproducing the recorded data while modifying a loop characteristic of a phase locked loop circuit for the record data of said recording medium;
    signal read/write means coupled to said recording signal processing circuit and said reproducing signal processing circuit for reading and writing signal from and to said recording medium;
    an interface for interfacing with a host;
    a controller circuit for controlling the exchange of data between said interface and said recording and reproducing signal processing circuits;
    a servo control circuit for controlling an operation of said signal read/write means;
    a phase locked loop circuit provided in each of the circuits for generating a sampling clock to be used for the signal processing of the data to be read or written; and
    a microprocessor communicating with each of said circuits for individually issuing command signals thereto;
    said phase locked loop circuit including complementary charge pumps and a voltage controlled oscillator integrally formed on a semiconductor substrate and having a loop filter which is not directly connected to ground and which is off-chip connected to said substrate, said voltage controlled oscillator having differential inputs connected across said loop filter;
    said phase locked loop circuit further including a circuit for changing a gain of only one of said charge pumps, a gain of said voltage controlled oscillator and a frequency of said voltage controlled oscillator in linked relation in accordance with a read position signal for said medium;
    whereby the recorded data is reproduced while the loop characteristic of said phase locked loop circuit is changed for the record data.

9. A magnetic recording and reproducing apparatus according to claim 8 wherein said charge pumps are D/A converter circuits.

10. A magnetic recording and reproducing apparatus according to claim 8 wherein a reference potential source independent from the ground is formed on said semiconductor substrate and a center point of said loop filter is connected to said reference voltage source.

* * * * *